(12) United States Patent
Sato et al.

(10) Patent No.: US 9,061,397 B2
(45) Date of Patent: Jun. 23, 2015

(54) DIAMOND FILM FOR CUTTING-TOOLS

(71) Applicant: UNION TOOL CO., Shinagawa, Tokyo (JP)

(72) Inventors: Akira Sato, Shinagawa-ku (JP); Yuji Watanabe, Shinagawa-ku (JP); Tetsutaro Ohori, Shinagawa-ku (JP); Shuntaro Suzuki, Shinagawa-ku (JP); Kazutaka Sato, Shinagawa-ku (JP)

(73) Assignee: UNION TOOL CO., Tokyo (JP)

( * ) Notice: Subject to any disclaimer, the term of this patent is extended or adjusted under 35 U.S.C. 154(b) by 130 days.

(21) Appl. No.: 13/854,573

(22) Filed: Apr. 1, 2013

(65) Prior Publication Data

US 2013/0330529 A1    Dec. 12, 2013

(30) Foreign Application Priority Data

Jun. 7, 2012   (JP) .................................. 2012-129664

(51) Int. Cl.
*C23C 16/27*   (2006.01)
*B24D 3/00*   (2006.01)

(52) U.S. Cl.
CPC ......... *B24D 3/008* (2013.01); *Y10T 428/24975* (2015.01); *C23C 16/271* (2013.01); *C23C 16/279* (2013.01); *B23C 2226/315* (2013.01); *B23C 2228/10* (2013.01)

(58) Field of Classification Search
CPC ..................... B23C 2226/315; B23C 2228/10
USPC ............ 51/307, 309; 428/216, 336, 408, 469, 428/472, 698
See application file for complete search history.

(56) References Cited

U.S. PATENT DOCUMENTS 7,883,775 B2 *   2/2011   Kazahaya et al. ............ 428/408

FOREIGN PATENT DOCUMENTS

| CN | 102059361 A | 5/2011 |
|---|---|---|
| EP | 1 649 955 A1 | 4/2006 |
| EP | 2 230 327 A1 | 9/2010 |
| JP | 2000-326105 A | 11/2000 |
| JP | 2001-179504 A | 7/2001 |
| JP | 2003-025117 A | 1/2003 |

(Continued)

OTHER PUBLICATIONS

Japanese Office Action issued in Japanese Application No. 2012-129664 dated Sep. 30, 2013.
Extended European Search Report, dated Aug. 8, 2013, issued in corresponding European Patent Application No. 12199227.5.

(Continued)

*Primary Examiner* — Archene Turner
(74) *Attorney, Agent, or Firm* — Sughrue Mion, PLLC (57) ABSTRACT

There is provided a diamond film for cutting-tools which has high toughness, excellent adhesiveness, high hardness, and in which tool service life is considerably improved in relation to cutting ultra-hard alloys and other very hard work materials. A diamond film for cutting-tools formed on a base material, in which at least one or more multilayered film layers [A] are included in which the layers are constituted by layering a film layer [α] having a film thickness of 1 µm or more and 15 µm or less and a film layer [β] having a film thickness of 1 µm or more and 20 µm or less so that the film layer [α] is disposed on the base material side and the film layer [β] is disposed on the surface layer side; the film thickness of the entire film body is set to 4 µm or more and 30 µm or less; and the film layer [α] and the film layer [β] have predetermined film compositions.

8 Claims, 5 Drawing Sheets

(56) References Cited

FOREIGN PATENT DOCUMENTS

| | | | |
|---|---|---|---|
| JP | 2010-194629 A | | 9/2010 |
| JP | 2011-062775 | * | 3/2011 |
| JP | 2011-104687 A | | 6/2011 |

OTHER PUBLICATIONS

Korean Office Action, dated Aug. 1, 2014, issued in corresponding Korean Patent Application No. 10-2012-0101460.

Office Action dated Sep. 12, 2014 issued in corresponding Taiwan patent application No. 101133474.

* cited by examiner

| Sample No. | | 1 | 2 | 3 | 4 | 5 | 6 | 7 |
|---|---|---|---|---|---|---|---|---|
| First layer | Crystal grain diameter | 0.5 μm | 0.5 μm | 0.5 μm | 0.5 μm | 0.3 μm | 0.6 μm | 1.5 μm |
| | Break-out section | I | I | I | I | I | I | II |
| | X value | 0.07 | 0.07 | 0.07 | 0.07 | 0.08 | 0.07 | 0.03 |
| | Thickness | 5 μm | 5 μm | 4.5 μm | 3 μm | 5 μm | 11 μm | 11 μm |
| Second layer | Crystal grain diameter | 2.5 μm | 0.8 μm | 1.5 μm | 1.5 μm | 0.5 μm | --- | --- |
| | Break-out section | II | II | II | II | II | --- | --- |
| | X value | 0.02 | 0.04 | 0.03 | 0.03 | 0.06 | --- | --- |
| | Thickness | 6 μm | 6 μm | 2.5 μm | 2.5 μm | 6 μm | --- | --- |
| Third layer | Crystal grain diameter | --- | --- | 0.3 μm | 0.8 μm | --- | --- | --- |
| | Break-out section | --- | --- | I | I | --- | --- | --- |
| | X value | --- | --- | 0.07 | 0.05 | --- | --- | --- |
| | Thickness | --- | --- | 4 μm | 3 μm | --- | --- | --- |
| Fourth layer | Crystal grain diameter | --- | --- | --- | 0.3 μm | --- | --- | --- |
| | Break-out section | --- | --- | --- | I | --- | --- | --- |
| | X value | --- | --- | --- | 0.07 | --- | --- | --- |
| | Thickness | --- | --- | --- | 2.5 μm | --- | --- | --- |
| Total thickness | | 11 μm | 11 μm | 11 μm | 11 μm | 11 μm | 11 μm | 11 μm |
| Film composition | | [A] | [A] | [A]+[B] | [A]+[α]+[B] | [A] | --- | --- |
| Number of cuts | | 1 | 1 | 4 | 4 | 1 | 0 | 0 |
| Remarks | | Present embodim. | Present embodim. | Present embodim. | Present embodim. | Present embodim. | Conven. ex. | Conven. ex. |

…

DIAMOND FILM FOR CUTTING-TOOLS

TECHNICAL FIELD

The present invention relates to a diamond film for coating tools that are used for cutting or otherwise processing ultra-hard alloys and other nonferrous work materials having a high degree of hardness.

BACKGROUND ART

Conventionally, ultra-hard alloy tools are widely used as cutting tools. Hard films such as TiN or TiAlN are typically applied to these ultra-hard alloy tools for the purpose of increasing abrasion resistance.

Also, ultra-hard alloy tools coated with a diamond film using chemical vapor disposition as disclosed in, e.g., Patent Document 1 have recently been used for cutting hard carbon materials, Si-containing aluminum alloys, and other nonferrous high-hardness work materials.

Currently, however, indications have appeared in which the diamond film is destroyed or otherwise damaged during cutting, and a sufficient abrasion resistance is not obtained in relation to ultra-hard alloys and other work materials having a very high degree of hardness.

Patent Documents

[Patent Document 1] Japanese Laid-open Patent Application No. 2003-25117

SUMMARY OF THE INVENTION

As a result of research on the film composition and film layer configuration of diamond films in view of the current situation described above, the researchers found that the problems described above can be solved by devising the film composition and the film layer configuration, and thereby provide a diamond film for cutting-tools having very excellent practicability, high toughness, excellent adhesiveness, and high hardness, and in which tool service life is considerably improved in relation to cutting ultra-hard alloys and other very hard work materials.

The main points of the present invention will be described.

The present invention relates to a diamond film for cutting-tools formed on a base material, the diamond film characterized in that:

at least one or more multilayered film layers [A] are included in which the layers are constituted by layering a film layer [α] having a film thickness of 1 μm or more and 15 μm or less and a film layer [β] having a film thickness of 1 μm or more and 20 μm or less so that the film layer [α] is disposed on the base material side and the film layer [β] is disposed on the surface layer side;

the film thickness of the entire film body is set to 4 μm or more and 30 μm or less, and the crystallization of the film layer [α] and the crystallization of the film layer [β] are continuous when the cross-section of the multilayered film layer [A] is observed using a cross-sectional TEM method;

the average crystal grain diameter of the film layer [α] measured along an imaginary line parallel to the base material surface is less than that of the film layer [β], and the average crystal grain diameter of the film layer [β] is 0.2 μm or more and 4 μm or less;

the break-out section of the film layer [β] is smoother than the break-out section of the film layer [α] when the break-out section of the multilayered film layer [A] is observed using the SEM method;

a columnar pattern extended in the thickness direction of the break-out section of the film layer [β] is included, an X value of the film layer [β] is less than an X value of the film layer [α] when a crystal part of the cross section of the multilayered film layer [A] is exposed to an electron beam to carry out electron energy-loss spectroscopy (EELS);

the X value of the layer [β] is 0.005 to 0.05;

a film layer [β] having a film thickness of the 0.5 μm or more and 10 μm or less is formed on the outermost layer;

the average crystal grain diameter of the film layer [B] as measured along an imaginary line parallel to the base material surface when the cross-section is observed using a cross-sectional TEM method is less than that of the film layer [β];

when observed using a SEM method, the break-out section of film layer [B] has more unevenness than the break-out section of the film layer [β]; and the X value of the film layer [B] is greater than the X value of the film layer [β], wherein the electron energy-loss spectrum as measured by EELS is assumed to be the sum of the following four Gaussian functions (1)~(4):

(1) J, having a peak at 280 to 290 eV
(2) K, having a peak at 285 to 295 eV
(3) L, having a peak at 290 to 300 eV
(4) M, having a peak at 300 to 310 eV, X is defined as $I_j/(I_j+I_k)$, where the peak intensity of J is $I_j$ and the peak intensity of K is $I_k$ when the peaks of the electron energy-loss spectrum are separated.

Also, the present invention relates to a diamond film for cutting-tools formed on a base material, the diamond film characterized in that:

at least one or more multilayered film layers [A] are included in which the layers are constituted by layering a film layer [α] having a film thickness of 1 μm or more and 15 μm or less and a film layer [β] having a film thickness of 1 μm or more and 20 μm or less so that the film layer [α] is disposed on the base material side and the film layer [β] is disposed on the surface layer side;

the film thickness of the entire film body is set to 4 μm or more and 30 μm or less;

an X value of the film layer [β] is less than that of the film layer [α] when a crystal part of a cross section of the multilayered film layer [A] is exposed to an electron beam to carry out electron energy-loss spectroscopy (EELS); and the X value of the film layer [β] is 0.005 to 0.05, wherein the electron energy-loss spectrum as measured by EELS is assumed to be the sum of the following four Gaussian functions (1)~(4):

(1) J, having a peak at 280 to 290 eV
(2) K, having a peak at 285 to 295 eV
(3) L, having a peak at 290 to 300 eV
(4) M, having a peak at 300 to 310 eV, and X is defined as $I_j/(I_j+I_k)$, where the peak intensity of J is $I_j$ and the peak intensity of K is $I_k$ when the peaks of the electron energy-loss spectrum are separated.

Also, the present invention relates to a diamond film for cutting-tools formed on a base material, the diamond film characterized in that:

at least one or more multilayered film layers [A] are included in which the layers are constituted by layering a film layer [α] having a film thickness of 1 μm or more and 15 μm or less and a film layer [β] having a film thickness of 1 μm or more and 20 μm or less so that the film layer [α] is disposed on the base material side and the film layer [β] is disposed on the surface layer side;

the film thickness of the entire film body is set to 4 μm or more and 30 μm or less, and the crystallization of the film layer [α] and the crystallization of the film layer [β] are continuous when the cross-section of the multilayered film layer [A] is observed using a cross-sectional TEM method;

the average crystal grain diameter of the film layer [α] measured along an imaginary line parallel to the base material surface is less than that of the film layer [β], and the average crystal grain diameter of the film layer [β] is 0.2 μm or more and 6 μm or less;

the break-out section of the film layer [β] is smoother than the break-out section of the film layer [α] when the break-out section of the multilayered film layer [A] is observed using the SEM method;

a columnar pattern extended in the thickness direction of the break-out section of the film layer [β] is included;

an X value of the film layer [β] is less than that of the film layer [α] when a crystal part of a cross section of the multilayered film layer [A] is exposed to an electron beam to carry out electron energy-loss spectroscopy (EELS);

and the X value of the film layer [β] is 0.005 to 0.05, wherein the electron energy-loss spectrum as measured by EELS is assumed to be the sum of the following four Gaussian functions (1)~(4):

(1) J, having a peak at 280 to 290 eV
(2) K, having a peak at 285 to 295 eV
(3) L, having a peak at 290 to 300 eV
(4) M, having a peak at 300 to 310 eV, and X is defined as $Ij/(Ij+Ik)$, where the peak intensity of J is $Ij$ and the peak intensity of K is $Ik$ when the peaks of the electron energy-loss spectrum are separated.

Also, the present invention relates to the diamond film for cutting-tools according to the first invention, characterized in that: a film layer [B] having a film thickness of 0.5 μm or more and 10 μm or less is formed on the outermost layer; the average crystal grain diameter of the film layer [B] as measured along an imaginary line parallel to the base material surface when the cross-section is observed using a cross-sectional TEM method is less than that of the film layer [β]; and when observed using a SEM method, the break-out section of film layer [B] has more unevenness than does the break-out section of the film layer [β].

Also, the present invention relates to the diamond film for cutting-tools according to the second invention, characterized in that: a film layer [B] having a film thickness of 0.5 μm or more and 10 μm or less is formed on the outermost layer; the average crystal grain diameter of the film layer [B] as measured along an imaginary line parallel to the base material surface when the cross-section is observed using a cross-sectional TEM method is less than that of the film layer [β]; and when observed using a SEM method, the break-out section of film layer [B] has more unevenness than does the break-out section of the film layer [β].

Also, the present invention relates to the diamond film for cutting-tools according to the third invention, characterized in that: a film layer [B] is formed having a film thickness of 0.5 μm or more and 10 μm or less on the outermost layer; the average crystal grain diameter of the film layer [B] as measured along an imaginary line parallel to the base material surface when the cross-section is observed using a cross-sectional TEM method is less than that of the film layer [β]; and when observed using a SEM method, the break-out section of film layer [B] has more unevenness than does the break-out section of the film layer [β].

Also, the present invention relates to the diamond film for cutting-tools according to the second invention, characterized in that: a film layer [B] having a film thickness of 0.5 μm or more and 10 μm or less is formed on the outermost layer; and the X value of the film layer [B] is greater than that of the film layer [β] when the crystal part of the cross-section of the film layer [B] is exposed to an electron beam to carry out electron energy-loss spectroscopy (EELS).

Also, the present invention relates to the diamond film for cutting-tools according to the third invention, characterized in that: a film layer [B] having a film thickness of 0.5 μm or more and 10 μm or less is formed on the outermost layer; and the X value of the film layer [B] is greater than that of the film layer [β] when the crystal part of the cross-section of the film layer [B] is exposed to an electron beam to carry out electron energy-loss spectroscopy (EELS).

Also, the present invention relates to a diamond film for cutting-tools according to the third invention, characterized in that the multilayered film layer [A] is disposed directly on the base material.

Also, the present invention relates to a diamond film for cutting-tools according to the third invention, characterized in that the base material is an ultra-hard alloy formed from hard grains having WC as a main component and a bonding material having Co as a main component.

Also, the present invention relates to a diamond film for cutting-tools according to the ninth invention, characterized in that the base material is an ultra-hard alloy formed from hard grains having WC as a main component and a bonding material having Co as a main component.

A diamond film for cutting-tools may be formed while a predetermined gas is introduced; and the film layer [B] is formed without introducing $O_2$ gas.

A diamond film for cutting-tools may have a base material that is an ultra-hard alloy formed from hard grains having WC as a main component and a bonding material having Co as a main component.

A diamond film for cutting-tools may have a multilayered film layer [A] disposed directly on the base material.

A diamond film for cutting-tools may have a base material that is an ultra-hard alloy formed from grains having WC as a main component and a bonding material having Co as a main component.

The present invention is constituted as described above, and is therefore a diamond film for cutting tools, having very excellent practicability, high toughness, excellent adhesiveness, and greater hardness, and in which tool service life is considerably improved in relation to cutting ultra-hard alloys and other very hard work materials.

BEST MODE FOR CARRYING OUT THE INVENTION

The embodiments considered advantageous for the present invention will be briefly described by showing the operation of the present invention.

It is possible to inhibit film separation and tool damage during cutting, and service life of the tools for cutting ultra-hard alloys and other very hard work materials is improved by using a multilayered film layer [A] having a predetermined configuration obtained by layering a film layer [α] and a film layer [β], which have predetermined film compositions.

EXAMPLES

Specific examples of the present invention will be described on the basis of the drawings.

The present example is a diamond film for cutting-tools formed on a base material and contains: at least one or more multilayered film layers [A] that are constituted by layering a film layer [α] having a film thickness of 1 μm or more and 15 μm or less and a film layer [β] having a film thickness of 1 μm or more and 20 μm or less so that the film layer [α] is disposed on the base material side and the film layer [β] is disposed on the surface layer side; the film thickness for the entire diamond film body is set to 4 μm or more and 30 μm or less, and crystallization of the film layer [α] and crystallization of the film layer [β] are continuous when the cross section of the multilayered film layer [A] (the cross section perpendicular to the base material surface) is observed using a cross-sectional TEM method; the average crystal grain diameter (a value in which the crystal grain diameter is measured horizontally when the vertical direction is considered to be the thickness direction) of the film layer [α] measured along an imaginary line parallel to the base material surface is less than that of the film layer (β), and the average crystal grain diameter of the film layer [β] is 0.2 μm or more and 6 μm or less; the break-out section of the film layer [β] is smoother than the break-out section of the film layer [α] when the break-out section of the multilayered film layer [A] (the section obtained from breaking out perpendicular to the base material surface) is observed using a SEM method. A columnar pattern that is extended in the thickness direction is included in the break-out section of the film layer [β]. When the crystal part of the cross section of the multilayered film layer [A] is exposed to an electron beam to carry out electron energy-loss spectroscopy (EELS), the electron energy-loss spectrum measured by the EELS is assumed to be the sum of four Gaussian functions: J, having a peak at 280 to 290 eV; K, having a peak at 285 to 295 eV; L, having a peak at 290 to 300 eV; and M, having a peak at 300 to 310 eV; and when the peaks of the electron energy-loss spectrum are separated, the X value of the film layer [β] is less than that of the film layer [α] when X is defined as X=Ij/(Ij+Ik), where Ij is the peak intensity of J and Ik is the peak intensity of K. The X value of the film layer [β] is 0.005 to 0.05.

Each part will be specifically described.

Used as the base material is an ultra-hard alloy composed of hard grains having tungsten carbide (WC) as a main component and a bonding material having cobalt (Co) as the main component. Specifically, a material in which the average grain diameter of the WC grains is set to 0.1 μm to 2 μm and the Co content is set to 5 to 15% by mass is used.

A multilayered film layer, which is constituted by layering so that the film layer [α] is arranged on the base material side and the film layer [β] is arranged on the surface side, is provided directly on the base material.

Also, a film layer [B] with a film thickness of 0.5 μm or more and 10 μm or less is formed on the outermost layer (on the multilayered film layer [A]) of the diamond film for cutting-tools.

The average crystal grain diameter of the film layer [B] as measured along an imaginary line parallel to the base material surface when the cross-section is observed using a cross-sectional TEM method is less than that of the film layer [β], and when observed using a SEM method, the break-out section of film layer [B] has more unevenness than does the film layer [β].

Furthermore, when the crystal part of the cross-section of the film layer [B] was exposed to an electron beam to carry out electron energy-loss spectroscopy (EELS), the X value of the film layer [B] was found to be greater than that of the film layer [β].

The same operational effect is exhibited not only with a configuration in which the multilayered film layer [A] is disposed on the ultra-hard alloy base layer and the film layer [B] is layered thereon, but also the case in which two or more multilayered film layers [A] are layered on the ultra-hard alloy base material and the film layer [B] is disposed on the outermost layer; the case in which the multilayered film layer [A] is disposed on the ultra-hard alloy base material, a film layer [α] is layered thereon, and a film layer [B] is disposed on the outermost layer; the case in which the multilayered film layer [A] is disposed on the ultra-hard alloy base material, a film layer [B] is disposed thereon, the multilayered film layer [A] is layered yet thereon, and a film layer [B] is disposed on the outermost layer; and other cases.

The reason for using the configurations described above and the effect of the configurations described above are described below.

The multilayered film layer [A] will be described.

The present inventors changed various conditions of film formation to form the diamond film on an ultra-hard alloy base material and observed the break-out section of the diamond film using the SEM method. As a result, a mode in which the break-out section surface was relatively smooth and which included a columnar pattern that extended in the thickness direction of the film (below indicated as break-out section mode II) and a mode in which the break-out section surface was relatively rough and the columnar pattern was not clear were observed in the break-out section using the SEM method (below indicated as break-out section mode I).

Next, various changes were made to the film formation conditions to form the diamond film on a ball end mill made of an ultra-hard alloy. A cutting test was carried out using an ultra-hard alloy as a work material, and the diamond film was observed and evaluated using SEM, cross-sectional TEM, and electron energy-loss spectroscopy (analysis by exposing a crystal part on a surface perpendicular to the base material surface, which was cut to a thickness of 100 nm or less, to an electron beam with a spot diameter of 1.5 nm).

As a result, it was observed that the abrasion resistance of the diamond film was greater in the case that the average crystal grain diameter as measured along an imaginary line when the line is drawn parallel to the base material surface in the diamond film of the break-out section mode II. It was also observed that when the average crystal grain diameter less than 0.2 μm, the abrasion resistance was slightly lower; and that there were cases in which the film cracked under cutting conditions in which high machining pressure was applied when the average crystal grain diameter exceeded 6 μm.

In other words, it was confirmed that a diamond film with an average crystal grain diameter of 0.2 μm or more and 6 μm or less in the break-out section mode II has excellent abrasion resistance, and that a diamond film with an average crystal grain diameter of preferably 0.4 μm or more and 4 μm or less has excellent abrasion resistance was confirmed.

Also, it was observed that the abrasion resistance increases as the above-mentioned X value grows smaller when electron energy-loss spectroscopy is carried out on the diamond film. When the X value exceeded 0.05, the abrasion resistance became slightly lower, and it was difficult to manufacture a film with a value less than 0.005. The software "PeakFit ver. 4.12" by SeaSolve Software, Inc. (software that separates spectral waveforms into a plurality of overlapping Gaussian functions using a nonlinear least-squares method and calculates the peak position, area, half-value width and other values of the Gaussian functions), which is software that is often used in spectral analysis, was used in the analysis of the electron energy-loss spectra.

In other words, it was confirmed that a diamond film with an X value of 0.005 or more and 0.05 or less has excellent abrasion resistance, and that preferably a diamond film with an X value of 0.005 or more and 0.04 or less has excellent abrasion resistance.

A peak (J) of 280 to 290 eV in the electron energy-loss spectrum corresponds to graphite, and means that a smaller X value indicates a diamond with greater purity. It is thought that this is the cause for the abrasion resistance to increase as the X value decreases.

However, there was a case in which a diamond film having the excellent abrasion resistance described above separated from the base material in the cutting test, and there was a somewhat of a problem in terms of adhesiveness. From the results of the cutting test, it was apparent that with the diamond film of break-out section mode I, adhesiveness was excellent in the case in which the average crystal grain diameter was relatively low in comparison with the above-described diamond film, which has excellent abrasion resistance. Also, it was apparent that adhesiveness was excellent for the case in which the above-described X value of when the diamond film was subjected to electron energy-loss spectroscopy was relatively greater in comparison with the above-described diamond film, which has excellent abrasion resistance.

Based on the above findings, a diamond film with excellent adhesiveness (film layer [α]) was formed directly on a base material (a ball end mill made of an ultra-hard alloy), a diamond film with excellent abrasion resistance (film layer [β]) was formed on the film layer [α], and a cutting test was carried out with the ultra-hard alloy as the work material. As a result, it was confirmed that the cutting distance (tool service life), which is the distance until the tool is damaged or the film separates, is considerably improved in comparison with the case of a single film layer [α] or a single film layer [β].

It is necessary for the film thickness of the film layer [α] to be 1 μm or greater, as effectiveness is low in a film that is too thin for the purpose of ensuring adhesiveness. On the other hand, the thickness is preferably 15 μm or less because the abrasion resistance of the multilayered film layer [A] is somewhat reduced when the film becomes excessively thick.

Also, it is necessary for the film thickness of the film layer [β] to be 1 μm or greater, as effectiveness is low in a film that is too thin for the purpose of ensuring abrasion resistance. On the other hand, the thickness is preferably 20 μm or less because the roughness of the film layer surface increases when the film becomes excessively thick.

Also, it is necessary for the film thickness of the entire film body to be 4 μm or greater, as tool service life cannot be lengthened when the film is too thin. On the other hand, the thickness is preferably 30 μm or less because separation occurs more often when the film becomes excessively thick, due perhaps to internal stress on the film.

The film layer [B] will be described.

There were cases in which, in comparison with the case of a single film layer [α] or a single film layer [β], there was considerable improvement in the tool service life of a diamond-coated end mill obtained by forming a film layer [α] directly on the base material (ball end mill made of an ultra-hard alloy) and forming the film layer [β] (formation of the multilayered film layer [A]) thereon, but breakage occurred during cutting nevertheless. The film layer [β] is thought to have a characteristic that is somewhat susceptible to cracking (having somewhat low toughness), because the crystal grains on film layer [β] are comparatively large, and a long and relatively rectilinear grain boundary is therefore present on the surface. Therefore, the average crystal grain diameter is relatively small in comparison with the film layer [β]. Moreover, the film layer provided with the break-out section mode I was formed on the outermost surface layer to carry out a cutting test. As a result, the breakage during cutting was considerably reduced.

Also, breakage during cutting was considerably reduced in the case in which a film layer in which the above-described X value is relatively greater than that of the film layer [β] is formed on the outermost surface layer, the X value being obtained by subjecting the diamond film to electron energy-loss spectroscopy.

Abrasion resistance (toughness) is considerably improved when a film layer (film layer [B]) with the above-described X value is relatively greater than that of the film layer [β] is formed on the outermost surface layer, the X value being obtained by subjecting the diamond film to electron energy-loss spectroscopy, or when a film layer provided with break-out section mode I and in which the average crystal grain diameter is relatively small in comparison with the film layer [β] is formed on the outermost surface layer. However, it is preferred that the average crystal grain diameter of the film layer [B] be as low as possible and less than that of the film layer [α] for the purpose of covering the long and relatively rectilinear grain boundary of the film layer [β]. Also, it is preferred that the film thickness of the film layer [B] be 0.5 μm or greater, because the effect of covering the grain boundary of the film layer [β] is reduced when the film is too thin, and it is preferred that the film thickness be 10 μm or less, because the abrasion resistance is somewhat lessened when the film is excessively thick.

The base material will be described.

Preferred as a type of material for the end mill matrix is an ultra-hard alloy formed from hard grains having WC as a main component and a bonding material having Co as a main component, which has excellent adhesiveness with the diamond film and which is often used for cutting high-hardness work materials.

The present example was constituted as described above, and consequently it is possible to inhibit film separation and tool damage during cutting, and service life of the tools for cutting ultra-hard alloys and other high-hardness work materials is improved by using a multilayered film layer [A] obtained by layering a film layer [α] and a film layer [β], which have predetermined film compositions.

Also, breakage resistance is improved and tool service life is extended by the film layer [B].

Therefore, the present example has very excellent practicability in which it is possible to have high toughness, excellent adhesiveness, high hardness, and considerably extended tool service life in a diamond coated ultra-hard alloy tool for cutting ultra-hard alloys and other very high-hardness work materials.

Experimental examples that support the results of the present example will be described.

Experimental Example 1

A hot-filament CVD was used on an ultra-hard alloy ball end mill (shank diameter φ4, diameter φ1) which had as a material an ultra-hard alloy matrix formed from hard grains having WC as a main component and a bonding material having Co as a main component, and a diamond film was formed while $H_2$ gas, $CH_4$ gas, and $O_2$ gas were introduced so that the end mill temperature was 650 to 800° C. and the gas pressure was 500 Pa. The gas flow ratio was $H_2:CH_4:O_2$=100:1 to 5:0 to 5.

A cutting test was carried out using a ball end mill coated with the diamond film, and using an ultra-hard alloy VM-40 (JIS standard) as the work material. The number of 4.3-mm×4.3-mm×0.6-mm square pockets that can be cut was evaluated using a rotational speed of 30,000 min$^{-1}$, a feed rate of 300 mm/min, an axial-direction notch depth of 0.1 mm, a transverse-direction notch depth of 0.05 mm, and oil mist as a coolant.

Figure 5:
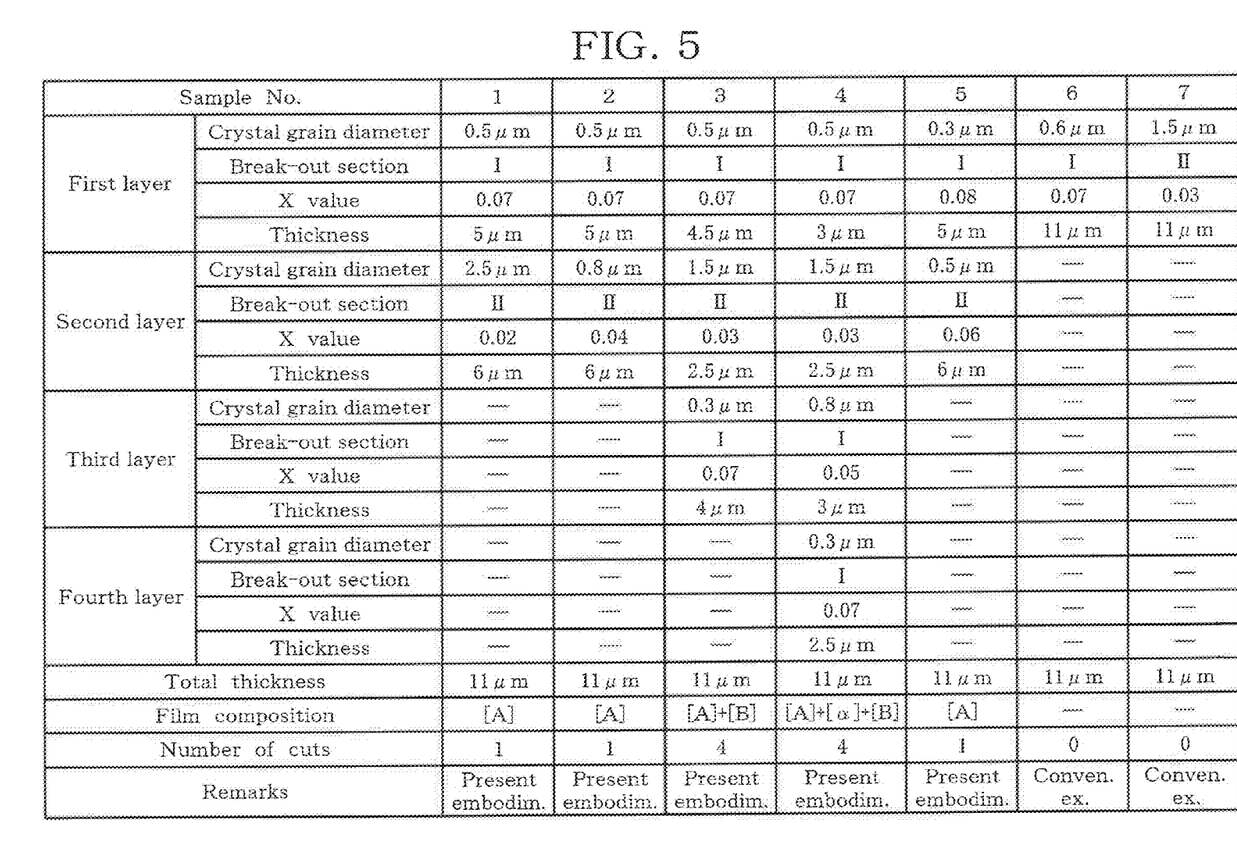
FIG. 5 is a chart showing the results of the experiments.

The results of the cutting test are shown in FIG. 5. From the results in FIG. 5, it is apparent that an end mill coated with the diamond film of the present example can obtain excellent tool service life in relation to the cutting of ultra-hard alloys in comparison with a ball end mill coated with a conventional diamond film.

Experimental Example 2

Figure 1:
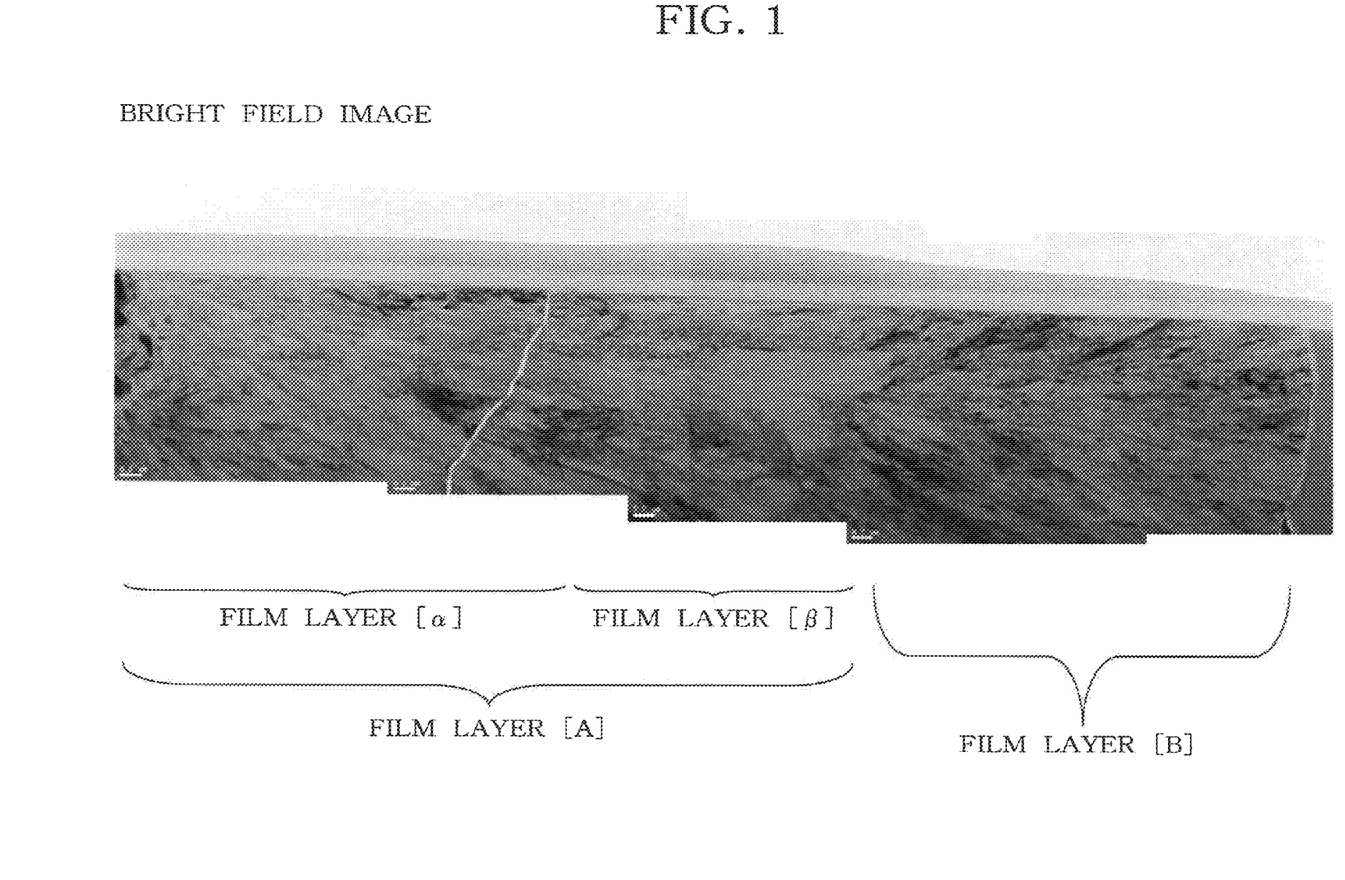
FIG. 1 is a photograph showing a cross-sectional TEM image (bright field image)
Figure 2:
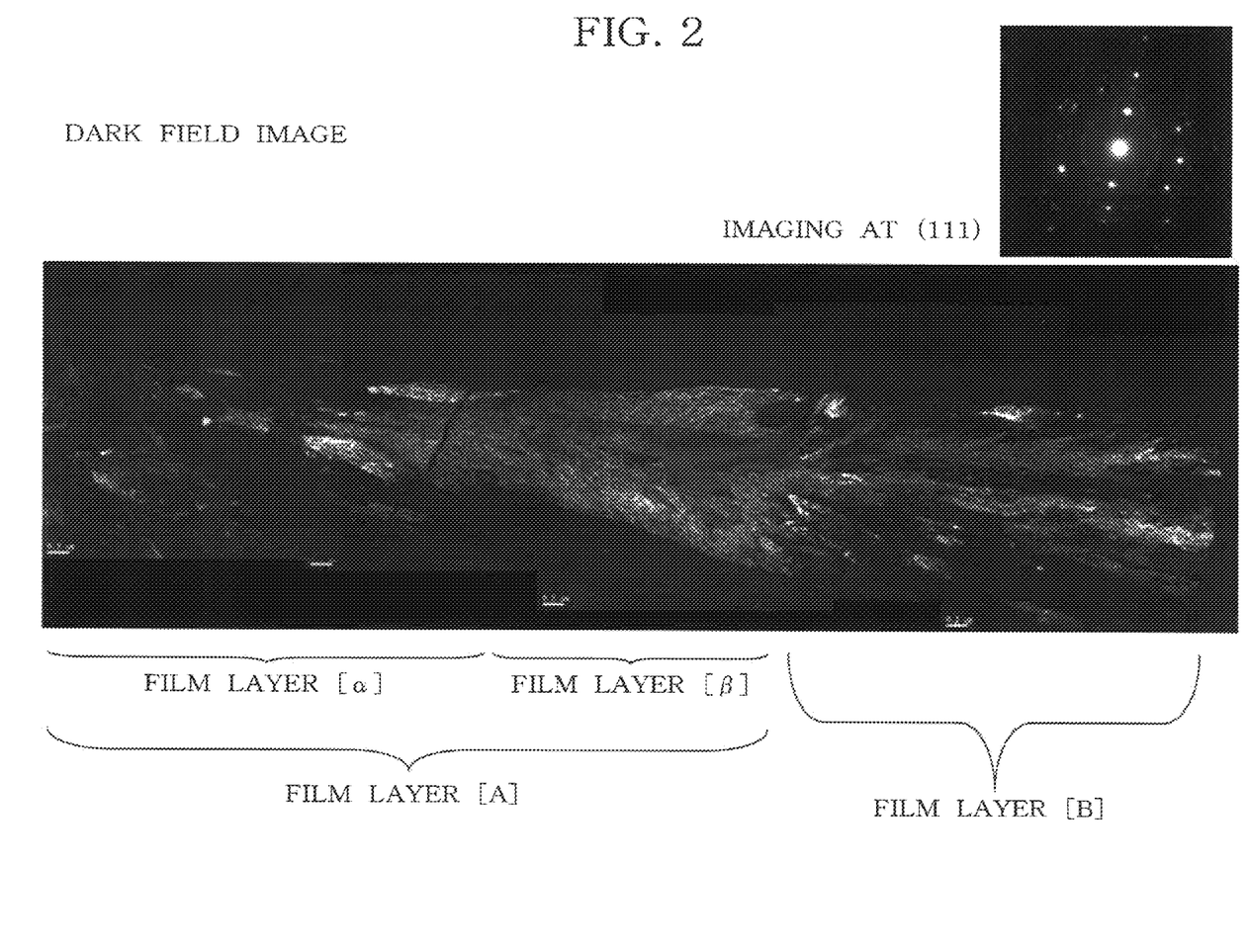
FIG. 2 is a photograph showing a cross-sectional TEM image (dark field image)

The cross-sectional TEM image, which is sample No. 3 of FIG. 5, is shown in FIGS. 1 and 2. FIG. 1 shows a bright field image, and FIG. 2 shows a dark field image. The electron beam diffraction image in the upper-right of FIG. 2 is an electron beam diffraction image obtained by exposing the sample diamond film to an electron beam; the crystal plane enclosed by the circles (image (111)) was imaged to photograph the dark field image of FIG. 2. From FIGS. 1 and 2, it was observed that crystallization between the film layer [α] and the film layer [β] is continuous, and that the crystal grain diameters of the film layer [α] and the film layer [B] are relatively small in comparison with the film layer [β].

The sample 3 is formed under conditions as described below. A hot-filament CVD was used on an ultra-hard alloy ball end mill (shank diameter φ4, diameter φ1) which had as a material an ultra-hard alloy matrix formed from hard grains having WC as a main component and a bonding material having Co as a main component, and a diamond film was formed while $H_2$ gas, $CH_4$ gas, and $O_2$ gas were introduced so that the end mill temperature was 750° C. and the gas pressure was 500 Pa. The gas flow ratio was $H_2:CH_4:O_2$=100:1:0 in the first layer, 100:2:1 in the second layer, and 100:4:0 in the third layer.

Figure 3:
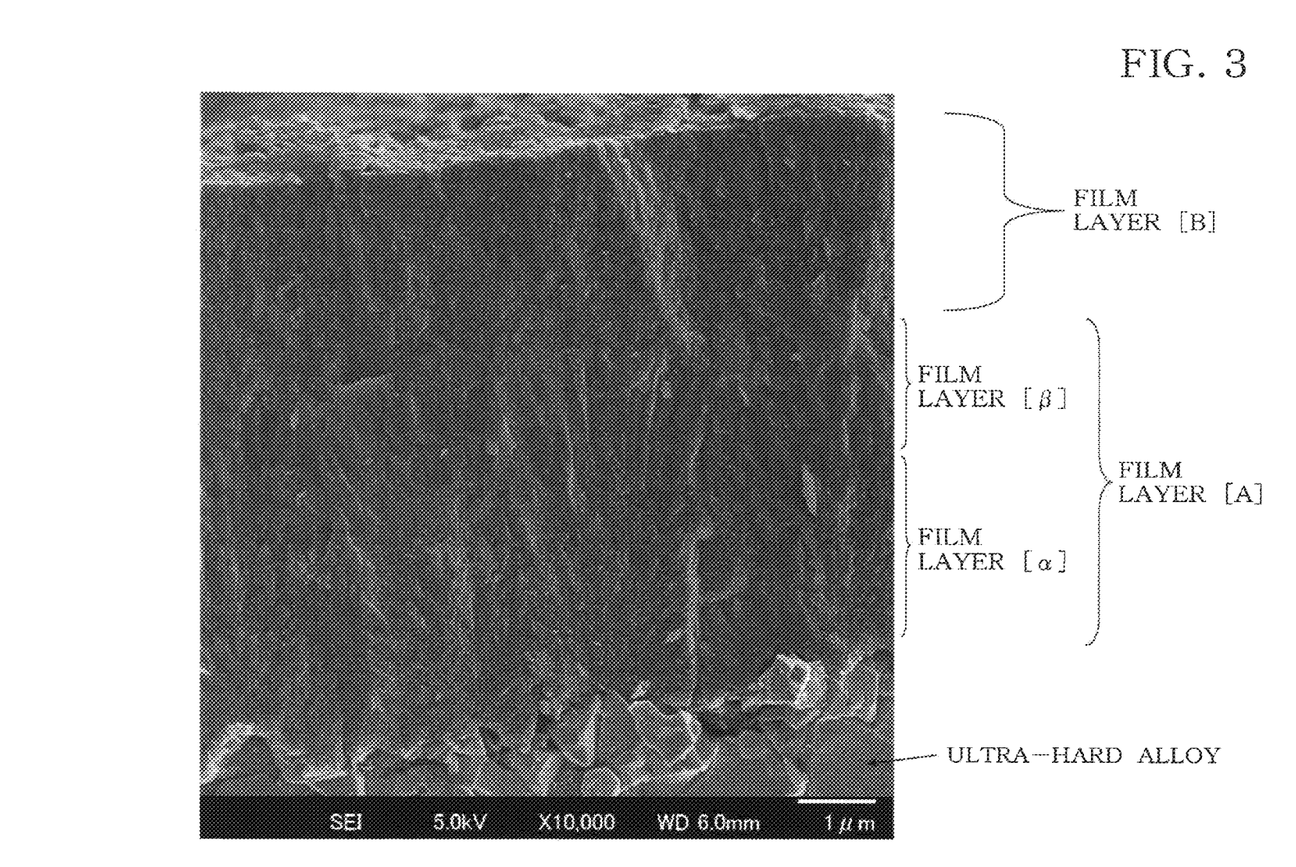
FIG. 3 is a photograph showing a break-out section of a SEM image.

Next, the break-out sectional SEM image, which is sample no. 3 of FIG. 5, is shown in FIG. 3. From FIG. 3, the break-out section of the film layer [β] was observed to be relatively smooth in comparison with the break-out section of the film layer [α] and the film layer [B], and that a columnar pattern extending in the thickness direction of the break-out section of film layer [β] was included.

Figure 4:
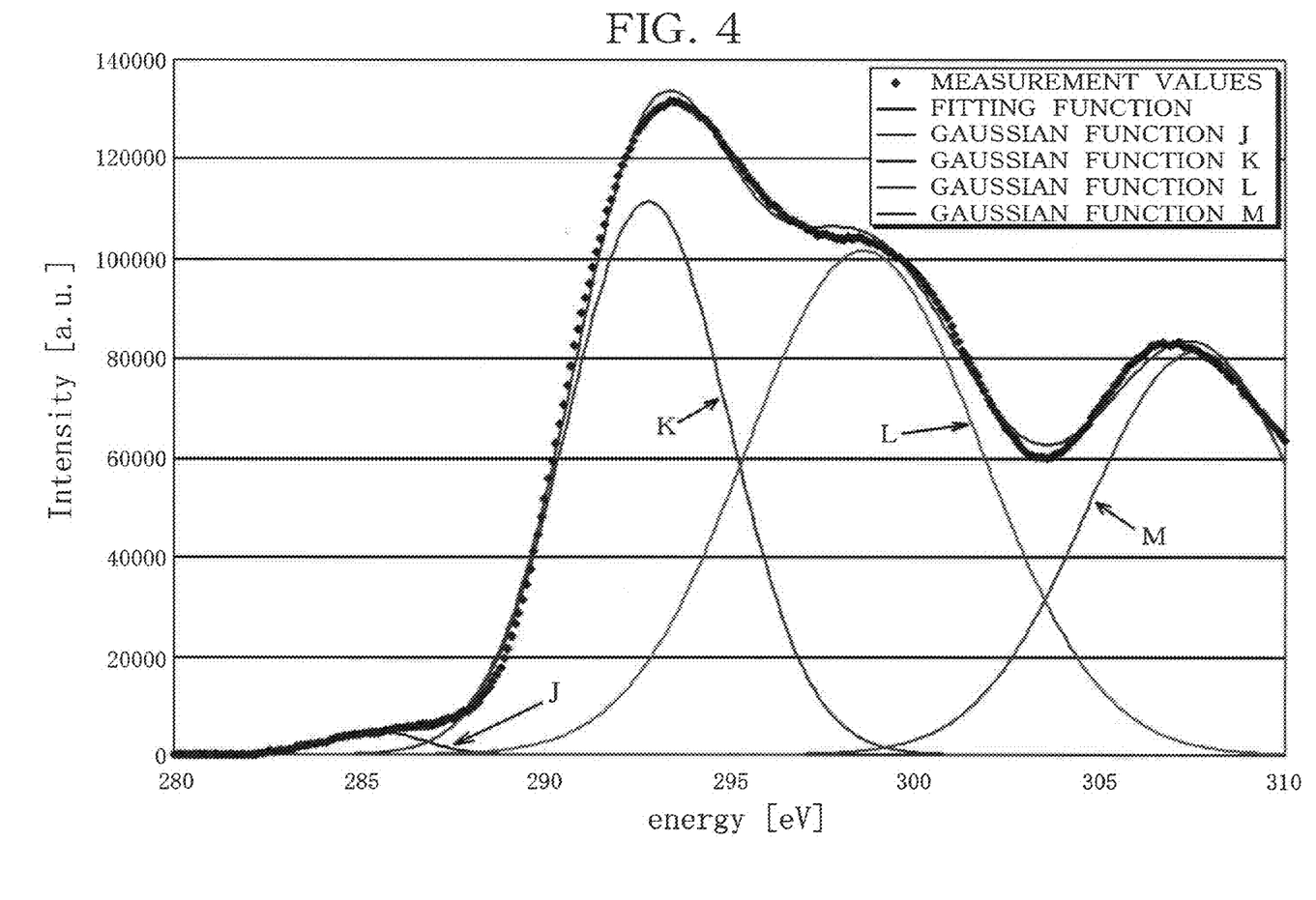
FIG. 4 is a graph showing the results of electron energy-loss spectroscopy (EELS) and peak separation.

FIG. 4 shows examples of electron energy-loss spectroscopy (EELS) and peak separation results. The vertical line shows the intensity of electron energy-loss spectrum and the horizontal one the energy of electron energy-loss spectrum. When the crystal part of the diamond film was exposed to an electron beam with a spot diameter of 1.5 nm to carry out EELS, the electron energy-loss spectrum was assumed to be the sum of four Gaussian functions: J, having a peak of 280 to 290 eV (in FIG. 4, to peak at 285.5 ev); K, having a peak of 285 to 295 eV (in FIG. 4, to peak at 293 ev); L, having a peak of 290 to 300 eV (in FIG. 4, to peak at 298.5 ev); and M, having a peak of 300 to 310 eV (in FIG. 4, to peak at 307.5 ev). The peaks were separated using the software "PeakFit ver. 4.12" by SeaSolve Software, Inc. In order to verify the validity of the peak separation, the sum of the four Gaussian functions J, K, L, and M are recorded as a fitting function in FIG. 4. The measured value and the fitting function are very consistent, and it is apparent that the peak separation method using the software "PeakFit ver. 4.12" by SeaSolve Software, Inc. is valid.

From the above, it can be confirmed that it is possible to inhibit film separation and tool damage during cutting, and to improve by a commensurate amount the service life of the tools for cutting ultra-hard alloys and other very hard work materials by using a multilayered film layer [A] obtained by layering a film layer [α] and a film layer [β], which have the film compositions described above, and a film layer [B].

The invention claimed is:

1. A diamond film for cutting-tools formed on a base material, the diamond film characterized in that:
   at least one or more multilayered film layers [A] are included in which the layers are constituted by layering a film layer [α] having a film thickness of 1 μm or more and 15 μm or less and a film layer [β] having a film thickness of 1 μm or more and 20 μm or less so that the film layer [α] is disposed on the base material side and the film layer [β] is disposed on the surface layer side;
   the film thickness of the entire film body is set to 4 μm or more and 30 μm or less, and the crystallization of the film layer [α] and the crystallization of the film layer [β] are continuous when the cross-section of the multilayered film layer [A] is observed using a cross-sectional TEM method;
   the average crystal grain diameter of the film layer [α] measured along an imaginary line parallel to the base material surface is less than that of the film layer [β], and the average crystal grain diameter of the film layer [β] is 0.2 μm or more and 4 μm or less;
   the break-out section of the film layer [β] is smoother than the break-out section of the film layer [α] when the break-out section of the multilayered film layer [A] is observed using the SEM method;
   a columnar pattern extended in the thickness direction of the break-out section of the film layer [β] is included;
   an X value of the film layer [β] is less than an X value of the film layer [α] when a crystal part of the cross section of the multilayered film layer [A] is exposed to an electron beam to carry out electron energy-loss spectroscopy (EELS);
   the X value of the layer [β] is 0.005 to 0.05;
   a film layer [B] having a film thickness of the 0.5 μm or more and 10 μm or less is formed on the outermost layer;
   the average crystal grain diameter of the film layer [B] as measured along an imaginary line parallel to the base material surface when the cross-section is observed using a cross-sectional TEM method is less than that of the film layer [β];
   when observed using a SEM method, the break-out section of film layer [B] has more unevenness than the break-out section of the film layer [β]; and
   the X value of the film layer [B] is greater than the X value of the film layer [β],
   wherein the electron energy-loss spectrum as measured by EELS is assumed to be the sum of the following four Gaussian functions (1)~(4):
   1) J, having a peak at 280 to 290 eV
   (2) K, having a peak at 285 to 295 eV
   (3) L, having a peak at 290 to 300 eV
   (4) M, having a peak at 300 to 310 eV, X is defined as $I_j/(I_j+I_k)$, where the peak intensity of J is $I_j$ and the peak intensity of K is $I_k$ when the peaks of the electron energy-loss spectrum are separated.

2. A diamond film for cutting-tools according to claim 1, characterized in that:
said diamond film for cutting-tools is formed while a predetermined gas is introduced;
and said film layer [B] is formed without introducing $O_2$ gas.

3. A diamond film for cutting-tools according to claim 1, characterized in that the multilayered film layer [A] is disposed directly on the base material.

4. A diamond film for cutting-tools according to claim 2, characterized in that the multilayered film layer [A] is disposed directly on the base material.

5. A diamond film for cutting-tools according to claim 1, characterized in that the base material is an ultra-hard alloy formed from grains having WC as a main component and a bonding material having Co as a main component.

6. A diamond film for cutting-tools according to claim 2, characterized in that the base material is an ultra-hard alloy formed from hard grains having WC as a main component and a bonding material having Co as a main component.

7. A diamond film for cutting-tools according to claim 3, characterized in that the base material is an ultra-hard alloy formed from grains having WC as a main component and a bonding material having Co as a main component.

8. A diamond film for cutting-tools according to claim 4, characterized in that the base material is an ultra-hard alloy formed from hard grains having WC as a main component and a bonding material having Co as a main component.

* * * * *